US012655517B2

(12) United States Patent
Carr et al.

(10) Patent No.: US 12,655,517 B2
(45) Date of Patent: Jun. 16, 2026

(54) METAL COMPONENTS WITH INERT VAPOR PHASE COATING ON INTERNAL SURFACES

(71) Applicant: Agilent Technologies, Inc., Santa Clara, CA (US)

(72) Inventors: Elizabeth Carr, Mountain View, CA (US); Karen Seaward, Palo Alto, CA (US); Kevin P. Killeen, Woodside, CA (US)

(73) Assignee: AGILENT TECHNOLOGIES, INC., Santa Clara, CA (US)

( * ) Notice: Subject to any disclaimer, the term of this patent is extended or adjusted under 35 U.S.C. 154(b) by 176 days.

(21) Appl. No.: 17/125,371

(22) Filed: Dec. 17, 2020

(65) Prior Publication Data

US 2021/0189554 A1     Jun. 24, 2021

Related U.S. Application Data

(63) Continuation of application No. 16/455,354, filed on Jun. 27, 2019, now Pat. No. 10,895,009, which is a
(Continued)

(51) Int. Cl.
*C23C 16/24* (2006.01)
*B01D 15/22* (2006.01)
(Continued)

(52) U.S. Cl.
CPC .............. *C23C 16/24* (2013.01); *B01D 15/22* (2013.01); *C23C 16/045* (2013.01);
(Continued)

(58) Field of Classification Search
CPC ....... C23C 16/24; C23C 16/28; C23C 16/401; C23C 16/402; C23C 16/308;
(Continued)

(56) References Cited

U.S. PATENT DOCUMENTS 4,376,641 A    3/1983 Nestrick et al.
4,928,421 A    5/1990 Staudner
(Continued)

FOREIGN PATENT DOCUMENTS

CN    1082623 A    2/1994
CN    1321752 C    6/2007
(Continued)

OTHER PUBLICATIONS

"Office Action on China Application No. 202011093915.3", mailed date Sep. 23, 2022, 13 pages.
(Continued)

*Primary Examiner* — Michael P Wieczorek
(74) *Attorney, Agent, or Firm* — Lando & Anastasi, LLP

(57) ABSTRACT

One aspect of the invention provides a method of making a thermal vapor coated article including a chemical vapor deposition of a coating on a surface of the article. The method includes exposing the article to one or more of (i) an inorganic precursor, (ii) an organic molecular precursor, (iii) a precursor to produce oxides or nitrides, or (iv) a combination thereof, wherein the coating is one or more of resistant to adhesion of biomolecules to the coated surface or inert to analytes in contact with the coated surface.

15 Claims, 3 Drawing Sheets

Related U.S. Application Data continuation of application No. 13/946,942, filed on Jul. 19, 2013, now abandoned.

(51) Int. Cl.

| | | |
|---|---|---|
| *C23C 16/04* | (2006.01) | |
| *C23C 16/32* | (2006.01) | |
| *C23C 16/40* | (2006.01) | |
| *C23C 16/44* | (2006.01) | |
| *C23C 16/455* | (2006.01) | |

(52) U.S. Cl.
CPC .......... *C23C 16/325* (2013.01); *C23C 16/401* (2013.01); *C23C 16/403* (2013.01); *C23C 16/405* (2013.01); *C23C 16/44* (2013.01); *C23C 16/45555* (2013.01); *Y10T 428/13* (2015.01)

(58) Field of Classification Search
CPC .... C23C 16/045; C23C 16/325; G01N 30/60; G01N 30/6052; G01N 30/6073; G01N 30/6078
See application file for complete search history.

(56) References Cited

U.S. PATENT DOCUMENTS

| | | | |
|---|---|---|---|
| 4,968,421 | A | 11/1990 | Spacek et al. |
| 5,480,677 | A | 1/1996 | Li et al. |
| 5,482,628 | A | 1/1996 | Schick |
| 5,651,885 | A | 7/1997 | Schick |
| 5,736,036 | A | 4/1998 | Upchurch et al. |
| 5,871,158 | A | 2/1999 | Frazier |
| 6,225,211 | B1 | 5/2001 | Tsui |
| 6,225,221 | B1 | 5/2001 | Ho et al. |
| 6,360,589 | B1 | 3/2002 | Kanda et al. |
| 6,380,663 | B1 | 4/2002 | Ikedo et al. |
| 6,416,577 | B1 | 7/2002 | Suntoloa et al. |
| 6,444,326 | B1 | 9/2002 | Smith |
| 6,511,760 | B1 | 1/2003 | Barone et al. |
| 6,613,560 | B1 | 9/2003 | Tso et al. |
| 6,716,693 | B1 | 4/2004 | Chan et al. |
| 6,729,352 | B2 | 5/2004 | O'Connor et al. |
| 6,749,813 | B1* | 6/2004 | David ................ G01N 30/6052 |
| | | | 422/500 |
| 7,070,833 | B2 | 7/2006 | Smith et al. |
| 7,175,812 | B2 | 2/2007 | Tatsumi |
| 7,175,815 | B2 | 2/2007 | Yamasaki et al. |
| 7,192,626 | B2* | 3/2007 | Dussarrat .......... H01L 21/02219 |
| | | | 427/255.394 |
| 7,879,396 | B2* | 2/2011 | Kobrin ..................... B05D 1/60 |
| | | | 436/514 |
| 7,964,097 | B2* | 6/2011 | Belov ................... G01N 30/56 |
| | | | 96/101 |
| 8,092,770 | B2* | 1/2012 | Betz ................... B01J 20/28033 |
| | | | 210/500.1 |
| 10,895,009 | B2 | 1/2021 | Carr et al. |
| 2002/0011771 | A1 | 1/2002 | Ikedo |
| 2002/0070674 | A1 | 6/2002 | Nakatsuka et al. |
| 2002/0123606 | A1 | 9/2002 | Kurian et al. |
| 2002/0176800 | A1 | 11/2002 | Henry et al. |
| 2002/0185442 | A1 | 12/2002 | Maiefski et al. |
| 2003/0013147 | A1 | 1/2003 | Hildenbrand |
| 2003/0152701 | A1 | 8/2003 | Kang et al. |
| 2004/0035774 | A1 | 2/2004 | Horsman et al. |
| 2004/0066703 | A1 | 4/2004 | Sparey-Taylor et al. |
| 2004/0171676 | A1 | 9/2004 | Ogata et al. |
| 2004/0238052 | A1 | 12/2004 | Karp et al. |
| 2005/0077222 | A1 | 4/2005 | Dawes et al. |
| 2005/0255579 | A1 | 11/2005 | Weis et al. |
| 2005/0271810 | A1 | 12/2005 | Kobrin et al. |
| 2006/0011468 | A1 | 1/2006 | Boardman et al. |
| 2006/0171654 | A1 | 8/2006 | Hawkins et al. |
| 2006/0223300 | A1 | 10/2006 | Simka et al. |

| | | | |
|---|---|---|---|
| 2007/0148326 | A1 | 6/2007 | Hastings et al. |
| 2008/0145276 | A1 | 6/2008 | Betz et al. |
| 2010/0224546 | A1 | 9/2010 | Ellis et al. |
| 2010/0245979 | A1 | 9/2010 | Londergan et al. |
| 2010/0298738 | A1 | 11/2010 | Felts et al. |
| 2011/0022160 | A1 | 1/2011 | Flanagan et al. |
| 2011/0133313 | A1 | 6/2011 | Rangarajan et al. |
| 2011/0186537 | A1* | 8/2011 | Rodriguez San Juan ................... |
| | | | C23C 16/30 |
| | | | 118/696 |
| 2011/0259089 | A1 | 10/2011 | Bouvier et al. |
| 2011/0263838 | A1* | 10/2011 | Belov ................ G01N 30/6043 |
| | | | 536/25.4 |
| 2011/0303404 | A1 | 12/2011 | Tea |
| 2012/0014848 | A1 | 1/2012 | Ellis et al. |
| 2012/0118806 | A1 | 5/2012 | Steinecker |
| 2012/0187305 | A1 | 7/2012 | Elam et al. |
| 2012/0202054 | A1* | 8/2012 | Endler ................... B82Y 30/00 |
| | | | 428/335 |
| 2012/0219727 | A1 | 8/2012 | Gandhiraman et al. |
| 2012/0251797 | A1 | 10/2012 | Smith et al. |
| 2012/0252709 | A1* | 10/2012 | Felts ................... A61M 5/3129 |
| | | | 508/100 |
| 2013/0014567 | A1 | 1/2013 | Bunner et al. |
| 2013/0065017 | A1 | 3/2013 | Sieber |
| 2014/0273525 | A1 | 9/2014 | Pang et al. |
| 2014/0323981 | A1 | 10/2014 | Giraud et al. |
| 2015/0024152 | A1 | 1/2015 | Carr et al. |
| 2015/0122365 | A1 | 5/2015 | Carr et al. |
| 2015/0297800 | A1* | 10/2015 | Weikart ............. A61M 5/3129 |
| | | | 422/430 |

FOREIGN PATENT DOCUMENTS

| | | |
|---|---|---|
| CN | 101680087 A | 3/2010 |
| CN | 101750449 A | 6/2010 |
| CN | 202814998 U | 3/2013 |
| CN | 103796835 A | 5/2014 |
| CN | 107109644 B | 11/2020 |
| CN | 112575313 A | 3/2021 |
| DE | 2523257 A1 | 12/1976 |
| DE | 2829568 A1 | 1/1980 |
| EP | 2826884 A1 | 1/2015 |
| JP | 57161648 A | 10/1982 |
| JP | S57161648 A | 10/1982 |
| JP | 2004037266 A | 2/2004 |
| JP | 2007507721 A | 3/2007 |
| JP | 2008511993 A | 4/2008 |
| JP | 2009503821 A | 1/2009 |
| JP | 2011139033 A | 7/2011 |
| JP | 2013527432 A | 6/2013 |
| WO | 0154829 A1 | 8/2001 |
| WO | 2005032688 A1 | 4/2005 |
| WO | 2006026350 A2 | 3/2006 |
| WO | 2006121573 A1 | 11/2006 |
| WO | 2007013924 A1 | 2/2007 |
| WO | 2008106613 A2 | 9/2008 |
| WO | 2008108754 A1 | 9/2008 |
| WO | 2010009311 A1 | 1/2010 |
| WO | 2011119922 A1 | 9/2011 |
| WO | 2014/033359 A1 | 3/2014 |

OTHER PUBLICATIONS

Barone, Gary A. et al.,"Advantages to using Inert, Coated Components for Sampling & Measurement of Organo-Sulfur Compounds", Restek Corporation, 2015, 1-5.

Barone, Gary A. et al.,"Anti-Corrosive and Anti-Coking Properties of Unique Surface Coating for Metal Substrates in Petrochemical Service", Restek Corporation, 2015, 1-5.

Barone, Gary et al.,"Selection of Surface Coatings for Process Lines and Equipment used in Corrosive and Reactive Streams", ISA 54th Analysis Division Symposium, 2009, 1-5.

Barone, Gary et al.,"Study of Chemical and Physical Adsorption Properties of Moisture, Sulfur, and Mercury Streams Through a Variety of Tubing Substrates", Analytical Solutions for Process

(56) References Cited

OTHER PUBLICATIONS

Control & Compliance, Instrumentation. Systems, and Automation Society, ISA 53rd Analysis Division Symposium, Apr. 20-24, 2008, 1-9.

Bertsch, Wolfgang et al.,"Deactivation of Metal Surfaces for Capillary Columns for GC by Deposition of Silicon", Journal of High Resolution Chromatography & Chromatography Communications, vol. 5, Sep. 1982, 498-500.

Dendoovan, J et al., "Modeling the Conformality of Atomic Layer Deposition: The Effect of Sticking Probability", Journal of The Electrochemical Society, vol. 156, No. 4, 2009, p. 63-p. 67.

EPO, et al.,"Extended European Search Report" mailed on Jul. 20, 2018, Application No. 15878268.0, 7 pages.

Firor, Roger L. et al., "Dual-Channel Gas Chromatographic System for the Determination of Low-Level Sulfur in Hydrocarbon Gases", Hydrocarbon Processing, Agilent Technologies, 2003, 1-10.

Firor, Roger L. et al., "Use of GC/MSD for Determination of Volatile Sulfur: Application in Natural Gas Fuel Cell Systems and Other Gaseous Streams", Fuel Cells, Petrochemicals, 2001, 1-10.

Gao, Feng et al., "Microscopic Silicon-based Lateral High-Aspect Ratio Structures for Thin Film Conformality Analysis", Journal of Vacuum Science & Technology A, vol. 33, No. 010601, 2015, 6 pages.

Gerhab, Glenn et al.,"Efficient and Rapid GC Analysis With Rugged Metal Microbore Capillary Columns", Restek Corporation, 1996, 43-58.

Gerhab, Glenn G. et al.,"Highly Inert Sample Pathways", Restek Corporation, 2015, 1-18.

Li, et al., "Octadecyl Modified Nano Silica Coated Capillary Column Application Of Capillary Electrochromatography", Journal of Analytical Science, vol. 26, No. 1, Feb. 2010, 9 pages.

PCT, et al., "International Search Report and Written Opinion" mailed on Feb. 23, 2016, Application No. PCT/US2015/60651, 11 pages.

PCT, et al., Third-Party Submission under 37 CFR 1.290 mailed on Feb. 27, 2015, Application No. PCT/US2010/054058, 30 pages.

Pretorius, Victor et al., "Deactivation of Metal Surfaces for Capillary Columns for GC by Deposition of Silicon", Journal of High Resolution Chromatography & Chromatography Communications, vol. 5, Sep. 1962, 498-500.

Pretorius, Victor et al.,"Gas Chromatography in Glass and Fused Silica Capillary Columns: Deactivation of the Inner Surface Using Silicon Films", Institute for Chromatography. University of Pretoria, Pretoria 0002. Republic of South Africa, Short Communications, Journal of HRC & CC, vol. 4, 1981, 344-345.

Restek, et al.,"Restek Performance Coatings Service Through Technology", 2003, 1.

Restek, et al., "Silcosteei® • UHV Dramatically Reduce Outgassing in UHV Systems", Restek Performance Coatings Division, 2003, 1-2.

Restek, et al., "Silcosteel®—CR Achieve specialty alloy performance using austenitic stainless steels!", 2004, 1-4.

Schuyler, Andrew et al., "Highly efficient and inert stainless steel GC columns: A durable, flexible alternative to fused-silica", Process Control and Quality vol. 3 , 1992, 167-171.

Silcotek, et al.,"SilcoTek Cover Letter", 2015, 1-2.

Smith, David A. et al., "Evaluation of System Surfaces in Low-Level Sulfur Analysis for the Petrochemical Industry", Restek Corporation, 2015, 1-10.

Smith, David A. et al., "Instrument and Sampling Equipment Passivation Requirements to Meet Current Demands for Low-Level Sulfur Analysis", Restek Corporation, 2015, 1-10.

Smith, David A. et al., "The Containment and Transfer of Trace Sulfur Gases at Low-PPBV Levels", Restek Corporation, 2015, 1-10.

Smith, David A. et al., "The Deposition and Functionalization of Silicon-Based Materials to Prevent Surface Corrosion, Adsorption, Contamination and Catalytic Interactions", SilcoTek Corporation, MS&T09, 2009, 1-6.

White, Geoffrey K. et al.,"Personal Communication", www.chromtech.net.au, Feb. 15, 2018, 1 page.

Zeeuw, Jaap D. et al.,"Comparing surface adsorption effects during the analysis of mercury and Sulfur containing streams", Restek Corporation, 2015, 1-8.

Zeeuw, Jaap D. et al., Deactivation of Metal Surfaces: Applications in Gas Chromatography (GC) for the Past 15 Years, American Laboratory, 2012, 1-10.

Office Action for U.S. Appl. No. 18/125,052, dated Oct. 18, 2023, 26 pages.

Search Report for Chinese application No. 2020110939153 (with English Translation), dated Apr. 15, 2024, 20 pages.

Dannong He, East China University of Science and Technology Press, "Nanomanufacturing", Dec. 31, 2011, p. 152.

* cited by examiner

METAL COMPONENTS WITH INERT VAPOR PHASE COATING ON INTERNAL SURFACES

CROSS-REFERENCE TO RELATED APPLICATIONS

This application is a continuation of U.S. patent application Ser. No. 16/455,354, filed on Jun. 27, 2019, which is a continuation of U.S. patent application Ser. No. 13/946,942, filed on Jul. 19, 2013, now abandoned, the contents of which are fully incorporated herein by reference.

FIELD OF THE INVENTION

The invention generally relates to coated metal components and related methods. More particularly, the invention relates to metal liquid chromatography components with uniformly coated internal surfaces and methods for achieving the same.

BACKGROUND OF THE INVENTION

Liquid chromatography (LC) is a chromatographic technique used to separate a mixture of compounds with the purpose of identifying, quantifying or purifying the individual components of the mixture. This separation occurs based on the interactions of the sample with the mobile and stationary phases. There are many stationary/mobile phase combinations that can be employed when separating a mixture. Liquid-solid column chromatography, the most popular chromatography technique, features a liquid mobile phase that slowly filters down through the solid stationary phase, bringing the separated components with it.

LC uses many metal components for transport of liquid. Examples include pump components, autosampler needles, and separation columns. Many samples analyzed by LC have no interaction with metal, but some samples, particularly those in bio-analytical applications, are sensitive to leached metal ions and/or are prone to interaction with metal surfaces giving rise to interference with the analytical process or impurities in the isolated components.

A conventional solution has been to use inert materials, such as polyether ether ketone (PEEK), for the flow path for these applications. In addition to being expensive, PEEK is difficult to form into many required shapes and sizes of LC components, and not readily available in all forms that are desired. Additionally, PEEK is not as strong as metal mechanically and is therefore unable to withstand the pressures (typically above about 400 bar) that are used for ultra-high pressure LC (UHPLC). Other existing approaches include inserting a biocompatible, polymeric inner tube inside a metallic outer tube and coating the metal tubing with liquid-phase organic layers. (U.S. Pat. Nos. 5,482,628; 5,651,885; 5,736,036; US Patent Application Nos. 20050255579; 20110259089.) Another approach is to use a glass tube inserted into a jacket made of metal or plastic, which has limited applications to LC components. (U.S. Pat. No. 4,968,421.)

Conventional approaches and existing alternative designs have exhibited the disadvantages of not adhering well to the metal surfaces being protected, not being able to coat uniformly down long lengths of small tubing, and not being able to coat small channels (e.g., 5-10 μm diameter).

Thus, there remains an unmet need for metal liquid chromatography components with continuous and uniformly coated internal surfaces and efficient methods for achieving the same.

SUMMARY OF THE INVENTION

The invention is based in part on the unique method for controlled and uniform coating of metal components having lengthy, narrow and/or constricted interior surfaces. The invention effectively addresses the problem of corrosion or interference of metal components in the flow path for LC analyses in which the sample interacts with metal ions or surfaces. The invention also alleviates the difficulties in coating very long metal tubes and very small metal channels with an inert, continuous coating that adheres well to metal surfaces. The metal flow path is rendered inert by the coating, and thus compatible with bioanalytical separations, for example, by using a vapor phase deposition process to coat the inner surfaces with a coating that continuously covers all metal surfaces in the flow path.

In one aspect, the invention generally relates to a metallic component having a lumen, passageway or cavity having an interior surface continuously covered with a protective coating having a substantially uniform thickness. The protective coating is formed via a vapor phase process that includes: providing one or more molecular precursors in the gas phase; exposing an interior surface of the lumen, passageway or cavity to the one or more molecular precursors in the gas phase; allowing the one or more molecular precursors to react, decompose, condense or otherwise change at or near the exposed interior surface and subsequently depositing thereon; and flushing with an inert gas or creating a vacuum thus removing unreacted one or more molecular precursors and reaction byproducts, if any.

In another aspect, the invention generally relates to a method for coating an interior surface of a metallic object having a lumen, passageway or cavity. The method includes forming a continuous protective coating having a substantially uniform thickness by a vapor-phase process.

In yet another aspect, the invention generally relates to a metallic object having an interior surface coated with a protective coating according to a method disclosed herein.

DEFINITIONS

Figure 1:
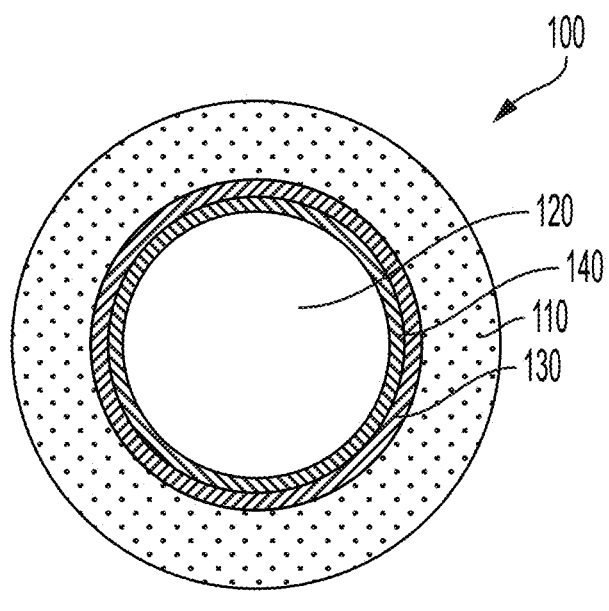
FIG. 1 shows a schematic illustration of an embodiment of the invention.

Unless defined otherwise, all technical and scientific terms used herein have the same meaning as commonly understood by one of ordinary skill in the art to which this invention belongs.

As used herein, the term "coating" and "coated" refer to a separate and distinct layer of material from an underlying material. A coated material exhibits an identifiable boundary, e.g. diffuse or abrupt, between the coating material and the underlying material, e.g. support material.

As used herein, the term "substantially uniform thickness" refers to a coating over a substrate that has a thickness across the entire coating area that is greater than a minimum thickness. As used herein, the minimum thickness refers to a coating having about 1 nm, about 5 nm, about 10 nm, about 50 nm, about 100 nm or more thickness.

As used herein, the term "fluid" refers to a liquid capable of flowing (e.g., through a flow channel) having at least one cross-sectional dimension less than 1 mm. For purposes of this disclosure, the term "fluid" does not encompass gasses.

As used herein, the term "microfluidic device" refers to a single unit that has a microfluidic reactor, microfluidic flow channels, and/or valves. Microfluidic devices may also have other microfluidic components, such as pumps, columns, mixers, and the like.

As used herein, the term "chemical vapor deposition" refers to a chemical process used to produce thin films or coatings. In a typical chemical vapor deposition (CVD) process, the substrate is exposed to one or more volatile precursors, which react, decompose, condense or otherwise change on or near the substrate surface to produce the desired deposit. Frequently, volatile by-products are also produced, which are removed by gas flow or vacuum through the reaction chamber. The materials to be deposited may take in various forms, including: monocrystalline, polycrystalline, amorphous, and epitaxial. In a typical CVD process, the substrate is heated to an elevated temperature, which can be important in allowing the precursors to react on the surface. In certain CVD processes, however, the deposition may be performed at room temperature. For example, certain atomic layer deposition (ALD) processes can be performed at ambient temperature.

CVD techniques include: atmospheric pressure CVD (APCVD)-CVD process at atmospheric pressure; low-pressure CVD (LPCVD)-CVD process at sub-atmospheric pressures (reduced pressures tend to reduce unwanted gas-phase reactions and improve film uniformity across the substrate); Ultrahigh vacuum CVD (UHVCVD)-CVD process at very low pressure, for example, below $10^{-6}$ Pa ($\sim 10^{-8}$ torr).

As used herein, the term "molecular precursor" refers to molecules in the gas phase that include one or more of the elements desired to be in the coating. These precursors can undergo a chemical or physical change such that the desired elements can be deposited on the surface and be incorporated in the coating. The molecular precursors can be inorganic or organic compounds. For example, the inorganic molecular precursors can include metal-based materials that would result in protective coating on the surface wherein the protective coating is selected from Si-based, Ti-based, Zr-based or Al-based inorganic compounds (e.g., oxides, nitrides or oxynitrides). The inorganic molecular precursors could also include, for example, $H_2O$ for producing oxides, or $NH_3$ for producing nitrides. For example, the organic molecular precursors can include polymeric materials that can result in Si-based polymeric materials as protective coating on the surface. The molecular precursors can also include metallo-organic materials, for example, tri-methyl aluminum, to provide means for including a metal, in this example, aluminum, into the coating. Many other possibilities for precursors exist and are evident in the literature, and precursors yet to be developed could also fall under the scope of this invention.

As used herein, the term "atomic layer deposition" or "ALD" refers to a type of thermal CVD in which layer-by-layer control of deposition of thin films is achieved using sequential, self-limiting surface reactions. The two half-reactions associated with a two precursor deposition are separated in time, and the reactor is purged with inert gas or evacuated to ensure physical separation of the precursors. Each half-reaction is self-limiting, leading to highly conformal and controllable deposition on structures of complex topography and high aspect ratio.

DETAILED DESCRIPTION OF THE INVENTION

The invention provides a unique method for achieving continuous and uniform interior coating of metal components with lengthy, narrow and constricted interior surfaces. Very long metal tubes with small metal channels can be coated with a continuous and uniform coating, such as an inert or protective coating. These components can be current parts, such as the metal tubes and fittings for separation columns, needles autosamplers, pumps, or microfluidic parts. The invention provides metal components that do not corrode or interfere with LC analyses and can be effectively used in the flow path for LC systems.

Vapor phase coating (e.g., CVD) of metal LC components for the flow path of LC system has several advantages over previous techniques that utilize non-metal components or non-coated metal parts. The coated metal is inert and does not interfere with LC analyses yet is strong enough to withstand pressures over 1,000 bar, making it compatible with conditions required in UHPLC analyses. Fabrication of parts is done in metal, rather than substrate such as PEEK-based materials, so a much greater variety of components are available for fabrication, including metal microfluidic parts and porous sintered metal fits. Vapor phase coating is preferable to liquid-phase coating because it is better able to coat long, narrow channels (e.g., less than 10 μm in diameter) and provide strong adhesion to metal.

The LC components may be fabricated from various metals as required (e.g., stainless steel, titanium or other metals or alloys). Although amorphous Si is effective in protecting metal surfaces exposed to gases or vacuum (U.S. Pat. Nos. 6,444,326; 6,511,760; 7,070,833), amorphous Si is subject to attack at high pH in liquid. Amorphous Si is thus not ideal to provide inertness in LC applications requiring high pH. As disclosed herein, thermal CVD for the deposition of inert coatings is now successfully extended to materials that are stable in both high and low pH solutions, high salt solutions, and a large variety of solvents. In addition, the coating is resistant to adhesion of biomolecules to the coating surface. The coating method according to the disclosed invention is able to coat long columns of metal LC components with small inner diameters with a coating that is continuous and adheres well to the metal column.

In one aspect, the invention generally relates to a metallic component having a lumen, passageway or cavity having an interior surface continuously covered with a protective coating having a substantially uniform thickness. The protective coating is formed via a vapor phase process that includes: providing one or more molecular precursors in the gas phase; exposing an interior surface of the lumen, passageway or cavity to the one or more molecular precursors in the gas phase; allowing the one or more molecular precursors to react, decompose, condense or otherwise change at or near the exposed interior surface and subsequently depositing thereon; and flushing with an inert gas or creating a vacuum thus removing unreacted one or more molecular precursors and reaction byproducts, if any.

In certain embodiments, the vapor phase process further includes: repeating one or more of the above steps as necessary to arrive at a desired film thickness and/or composition.

In another aspect, the invention generally relates to a method for coating an interior surface of a metallic object having a lumen, passageway or cavity. The method includes forming a continuous protective coating having a substantially uniform thickness by a vapor-phase process.

In certain preferred embodiments, the vapor phase process comprises a chemical vapor deposition process.

In certain preferred embodiments, the vapor phase process includes an atomic layer deposition process.

In certain embodiments, the lumen, passageway or cavity is characterized by at least one dimension of less than about 10 mm and one dimension longer than about 20 mm. In certain embodiments, the metallic component is a chromatographic column characterized by an inner diameter of less than about 10 mm (e.g., less than about 5 mm, 3 mm, 1 mm, 500 $\mu$m, 300 $\mu$m, 100 $\mu$m, 50 $\mu$m, 30 $\mu$m, 10 $\mu$m, 5 $\mu$m) and a length greater than about 20 mm (e.g., greater than about 30 mm, 50 mm, 100 mm, 500 mm, 1,000 mm, 5,000 mm).

In certain embodiments, the protective coating has a substantially uniform thickness in the range of about 10 nm to about 5 $\mu$m (e.g., about 10 nm to about 500 nm, about 10 nm to about 300 nm, about 10 nm to about 200 nm, about 10 nm to about 100 nm, about 10 nm to about 80 nm, about 10 nm to about 50 nm, about 20 nm to about 800 nm, about 50 nm to about 800 nm, about 100 nm to about 800 nm, about 200 nm to about 800 nm, about 300 nm to about 800 nm, about 100 nm to about 500 nm, about 100 nm to about 300 nm, about 200 nm to about 500 nm).

In certain embodiments, the metallic component is a microfluidic device or a component thereof having at least one interior dimension less than about 1 mm (e.g., less than about 500 $\mu$m, 300 $\mu$m, 100 $\mu$m, 50 $\mu$m, 30 $\mu$m, 10 $\mu$m, 5 $\mu$m).

In certain embodiments, the metallic component is a porous metal frit such as the kind used to hold in place the silica particles that are the solid stationary phase in a liquid chromatographic column. The coating covers surfaces that will be in contact with the liquid mobile phase and includes interior surfaces and/or exterior surfaces of the frit.

The protective coating may be any suitable material, for example, a material selected from Si-based, Ti-based, Zr-based or Al-based inorganic compounds (e.g., oxides, nitrides or oxynitrides). In certain embodiments for metal parts used in LC applications, the protective coating includes a material selected from $SiO_2$, SiC, $Si_3N_4$, $SiO_xC_y$, $SiO_xN_y$, $SiC_xH_y$, $Al_2O_3$, $TiO_2$, $ZrO_2$, $Y_2O_3$ and mixtures thereof.

The coating can also be multilayered (2, 3, 4 or more layers each comprising a different protective material). For example, an initial coating may be a Si coating layer for good adhesion to the metal, followed by a coating of SiC for chemical inertness. FIG. 1 is a schematic illustration of a cross-section of a column 100 with a metallic tubing 110, a passageway 120, and two coated layers on the inside surface, 130 and 140.

The metallic component may be made of any suitable material, for example, stainless steel, titanium, or titanium alloy.

In yet another aspect, the invention generally relates to a metallic object having an interior surface coated with a protective coating according to a method disclosed herein.

Four bio-inert coatings were formed and tested on stainless steel and titanium parts.

Example 1 Amorphous Si Coating

The first coating, an amorphous Si coating, was deposited on stainless steel coupons, frits and HPLC columns, and on titanium coupons. Deposition was done by thermal chemical vapor deposition in a closed reactor using $SiH_4$ gas as a molecular precursor. Temperature for deposition was between 350° C. and 450° C. and partial pressure of $SiH_4$ in the reactor was between 50-1000 mbar in dry nitrogen gas. Two depositions were done in succession to achieve a coating thickness of 550 nm on coupons and 100 nm in the interior of the HPLC column. Coating thickness on the coupons was measured using spectral reflectance and verified by X-ray Photoelectron Spectroscopy. Coating thickness on the column interior was estimated from the relative intensities of the Fe K series and Si K series lines from Energy Dispersive X-ray Spectroscopy, compared to relative intensities on flat surfaces with known a-Si thickness. Thickness of the coating on titanium coupons, deposited in a separate run, was 200 nm.

Effectiveness of the coatings for providing bio-inertness was evaluated by soaking the parts in 0.1% formic acid for a period of days and measuring the metal ions released into solution using Inductively Coupled Plasma-Mass Spectrometry. Both coated stainless steel coupons and coated stainless steel frits provided greater than 10× reduction in metal ion concentration compared to similar uncoated parts.

Figure 2:
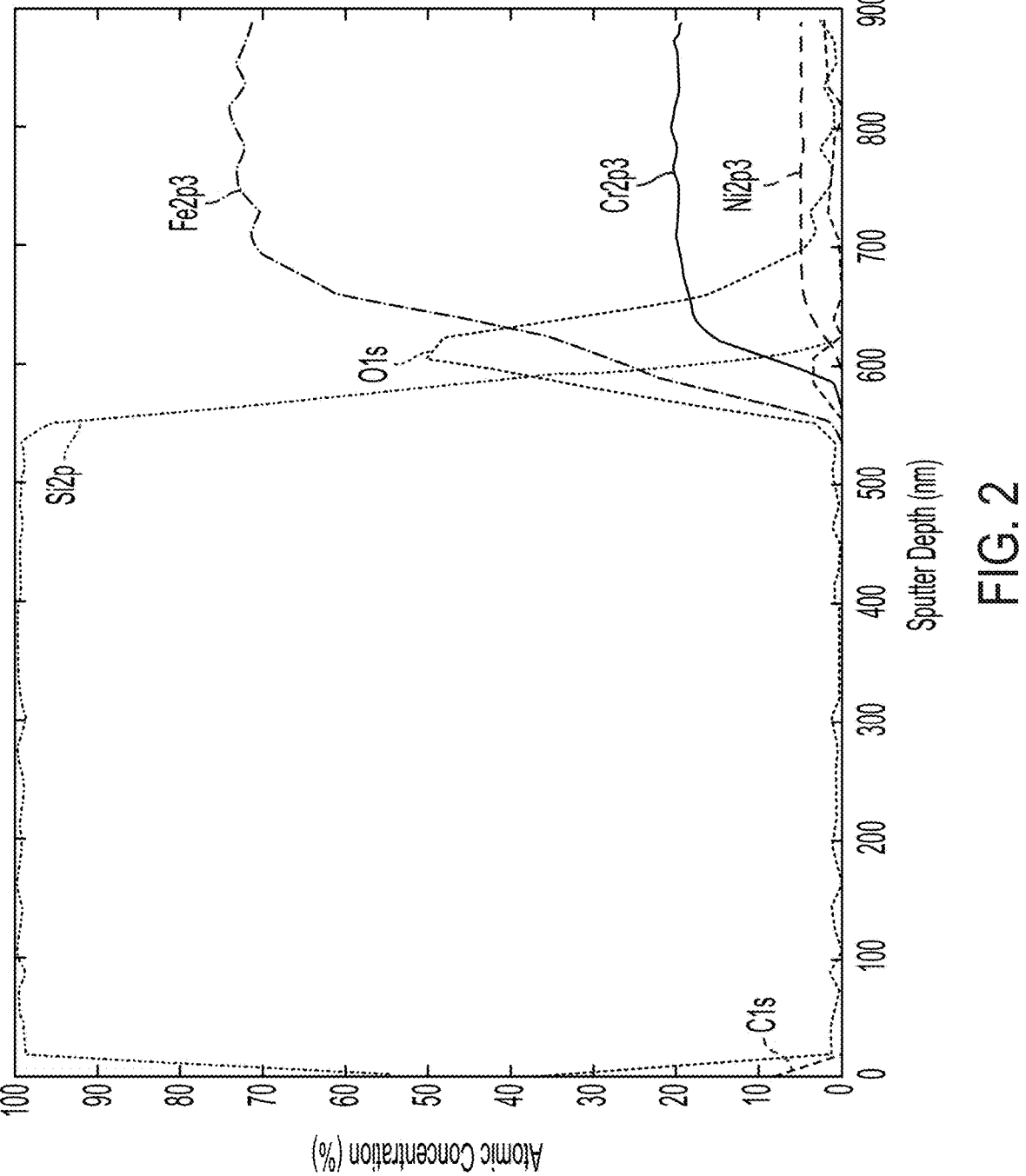
FIG. 2 shows exemplary data of X-ray Photoelectron Spectroscopy compositional depth profile of a-Si coating on stainless steel.

FIG. 2 shows X-ray Photoelectron Spectroscopy compositional depth profile of a-Si coating on stainless steel.

Example 2 Polymeric Siloxane Coating

The second coating, a polymeric siloxane coating, was deposited using chemical vapor deposition at a temperature between 350° C. and 450° C. Coating thicknesses of 100 nm to 300 nm were achieved on stainless steel coupons, stainless steel fits, and on the interior surface of HPLC columns. All parts demonstrated greater than 10× reduction in metal ion concentration released into solution when soaked in 0.1% formic acid. In addition, a siloxane coated HPLC column was packed with silica beads held in place by two siloxane-coated frits. This column showed superior performance to a stainless steel column with stainless steel fits in a liquid chromatography separation of Cytochrome C, an enzyme known to be sensitive to metal ions.

Example 3 Bilayer Coating (Si/Siloxane)

The third coating was a bilayer consisting of 200 nm of a-Si directly on the stainless steel, covered by 150 nm of siloxane coating on the a-Si. This coating was deposited by the above described chemical vapor deposition processes on stainless steel coupons. These coupons demonstrated 10× reduction in metal ion concentration after soaking in 0.1% formic acid. A similar bilayer was also deposited on the interior surface of an HPLC column and demonstrated a superior liquid chromatography separation of Cytochrome C compared to a stainless steel column.

Figure 3:
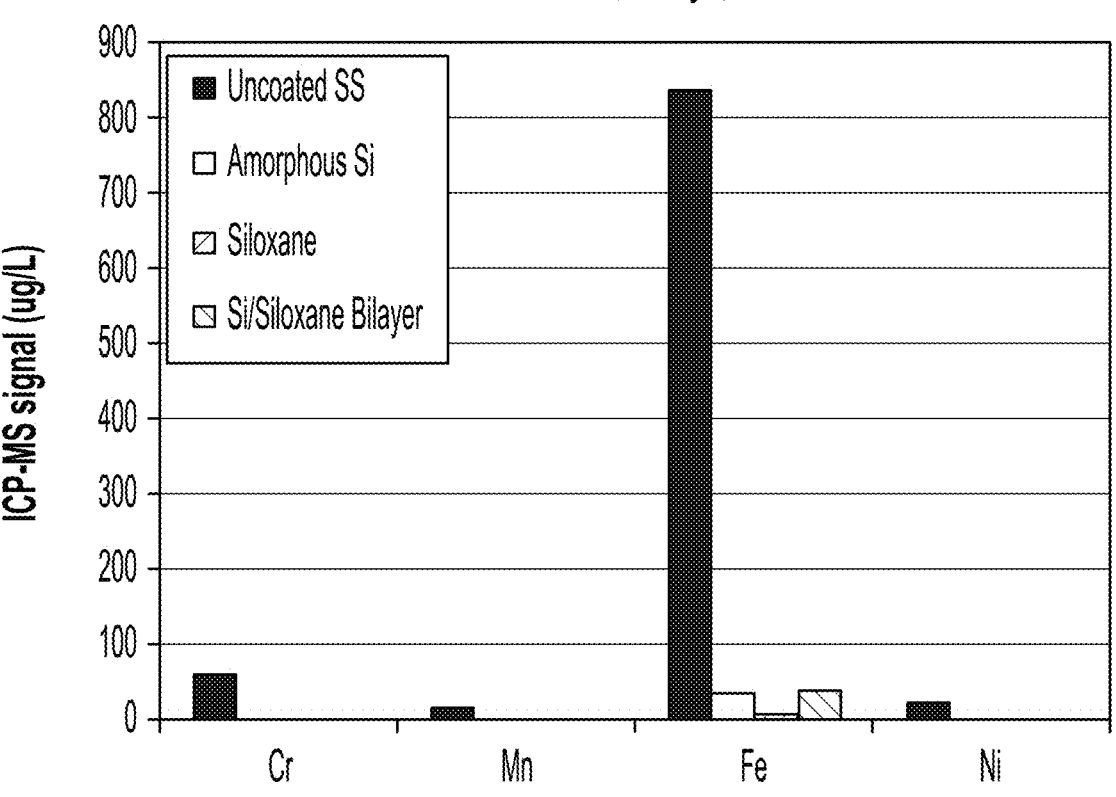
FIG. 3 shows exemplary data on comparison of ions leached into solution from 2×3 cm stainless steel coupons coated with a-Si, siloxane, and Si/Siloxane bilayer compared to ions leached from uncoated stainless steel.

FIG. 3 shows comparison of ions leached into solution from 2×3 cm stainless steel coupons coated with a-Si, siloxane, and Si/Siloxane bilayer compared to ions leached from uncoated stainless steel. Coupons were soaked in 0.1% formic acid at 50 C for four days. Metal ion concentration in solution measured by Inductively Coupled Plasma-Mass Spectrometry.

Example 4 Bilayer Coating ($Al_2O_3$/$TiO_2$)

The fourth coating was a bilayer of $Al_2O_3$ underneath $TiO_2$, deposited by atomic layer deposition. This $Al_2O_3$/$TiO_2$ bilayer was deposited on stainless steel coupons and flits, and on the interior and exterior surfaces of 100 mm long capillaries with inner diameters of 100 μm and 250 μm. The coating was deposited with 100 cycles of alternating exposures of trimethyl aluminum and water at 200 C, followed by 827 cycles of alternating exposure of Tetrakis (dimethylamido)titanium(IV) and water at 200° C. Final thickness of the layers were approximately 7 nm of $Al_2O_3$ and 40 nm of $TiO_2$.

INCORPORATION BY REFERENCE

References and citations to other documents, such as patents, patent applications, patent publications, journals, books, papers, web contents, have been made in this disclosure. All such documents are hereby incorporated herein by reference in their entirety for all purposes. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

EQUIVALENTS

The representative examples disclosed herein are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples which follow and the references to the scientific and patent literature cited herein. The following examples contain important additional information, exemplification and guidance that can be adapted to the practice of this invention in its various embodiments and equivalents thereof.

What is claimed is:

1. A method of coating a liquid chromatograph instrument component by a vapor phase process, the method comprising:

introducing a vapor phase material comprising an inorganic precursor, an organic molecular precursor, or a combination thereof, a precursor to produce oxides, and a precursor to produce nitrides into an interior surface of a lumen of a metal liquid chromatograph instrument component to form a coating on the interior surface of the lumen, the lumen having an inner diameter of less than 3 mm and a length greater than 20 mm;

removing any vapor phase material that has not become part of the coating on the interior surface of the lumen; and repeating the vapor phase material introduction until a desired coating thickness and/or composition is achieved, wherein the coating formed on the interior surface of the lumen is resistant to adhesion of biomolecules and/or inert to analytes.

2. The method of claim 1, wherein the precursor to produce nitrides is $NH_3$.

3. The method of claim 1, wherein the precursor to produce oxides is $H_2O$.

4. The method of claim 1, wherein the coating comprises a plurality of layers each comprising a different material.

5. The method of claim 1, wherein the coating includes a thickness of from about 10 nm to about 5 μm.

6. The method of claim 1, wherein the coating is one or more forms of monocrystalline, polycrystalline, amorphous, or epitaxial.

7. The method of claim 6, wherein the coating includes Si—C bonds.

8. The method of claim 1, wherein the vapor phase process is chemical vapor deposition.

9. The method of claim 8, wherein the chemical vapor deposition is performed at a sub-atmospheric pressure.

10. The method of claim 8, wherein the chemical vapor deposition is atmospheric pressure CVD, low-pressure CVD or ultrahigh vacuum CVD.

11. The method of claim 1, wherein the organic molecular precursor is a Si-based precursor.

12. The method of claim 1, wherein the coating comprises $SiO_2$, SiC, $Si_3N_4$, $SiO_xC_y$ (wherein 2x+4y=4), $SiO_xN_y$ (wherein 2x+3y=4), $SiC_xH_y$ (wherein 4x+y=4), $Al_2O_3$, $TiO_2$, $ZrO_2$, $Y_2O_3$, or a mixture thereof.

13. The method of claim 1, wherein the coating is a Si-based polymeric material.

14. The method of claim 1, wherein the lumen has an inner diameter of less than 100 μm.

15. The method of claim 1, wherein the lumen has an inner diameter of less than 10 μm.

* * * * *